(12) United States Patent
Zhou et al.

(10) Patent No.: US 9,136,350 B2
(45) Date of Patent: Sep. 15, 2015

(54) RF LDMOS DEVICE AND FABRICATION METHOD THEREOF

(71) Applicant: Shanghai Huahong Grace Semiconductor Manufacturing Corporation

(72) Inventors: Zhengliang Zhou, Shanghai (CN); Han Yu, Shanghai (CN); Ying Cai, Shanghai (CN); Xi Chen, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 50 days.

(21) Appl. No.: 14/074,800

(22) Filed: Nov. 8, 2013

(65) Prior Publication Data

US 2014/0131796 A1    May 15, 2014

(30) Foreign Application Priority Data

Nov. 9, 2012    (CN) .......................... 2012 1 0445971

(51) Int. Cl.
*H01L 21/336* (2006.01)
*H01L 29/66* (2006.01)
*H01L 29/78* (2006.01)

(52) U.S. Cl.
CPC ...... *H01L 29/66681* (2013.01); *H01L 29/7823* (2013.01)

(58) Field of Classification Search
CPC ..................... H01L 29/66681; H01L 29/7823
USPC .......................................... 438/286; 257/336
See application file for complete search history.

(56) References Cited

U.S. PATENT DOCUMENTS 6,746,928 B1 *   6/2004   Schuegraf et al. ............ 438/314
6,992,338 B1 *   1/2006   Yin et al. ...................... 257/197

* cited by examiner

*Primary Examiner* — Theresa T Doan
(74) *Attorney, Agent, or Firm* — MKG LLC

(57) ABSTRACT

A radio frequency (RF) laterally diffused metal oxide semiconductor (LDMOS) device is disclosed which additionally includes a lightly-doped P-type buried layer under a P-type channel region and a moderately-dope P-type buried layer in the lightly-doped P-type buried layer. The two buried layers result in a lower base resistance for an equivalent parasitic NPN transistor, thereby impeding the occurrence of snapback in the device. Additionally, an equivalent reverse-biased diode formed between the channel region and the buried layers is capable of clamping the drain-source voltage of the device and sinking redundant currents to a substrate thereof. Furthermore, the design of a gate oxide layer of the RF LDMOS device to have a greater thickness at a proximal end to a drain region can help to reduce the hot-carrier effect, and having a smaller thickness at a proximal end to the source region can improve the transconductance of the RF LDMOS device.

14 Claims, 8 Drawing Sheets

RF LDMOS DEVICE AND FABRICATION METHOD THEREOF

CROSS-REFERENCE TO RELATED APPLICATIONS

This application claims the priority of Chinese patent application number 201210445971.8, filed on Nov. 9, 2012, the entire contents of which are incorporated herein by reference.

TECHNICAL FIELD

The present invention relates to the field of semiconductor integrated circuits, and particularly, to radio frequency (RF) laterally diffused metal oxide semiconductor (LDMOS) devices for use in the amplification of high power RF signals. The invention also relates to fabrication methods of the RF LDMOS devices.

BACKGROUND

Radio frequency (RF) laterally diffused metal oxide semiconductor (LDMOS) devices are RF power devices that have been widely used in radio and television base stations, mobile communications base stations, radars and many other applications. They have a variety of advantages such as high linearity, high gain, high withstand voltage and great output power. When sorted by working voltage, RF LDMOS devices can be categorized into 28 V and 50 V ones with a required breakdown voltage of 70 V and 120 V, respectively. FIG. 1 shows a common prior art N-type RF LDMOS device including a P-type substrate 1 and a P-type epitaxial layer 2 formed on the P-type substrate 1. A P-type channel region 5 and a lightly-doped N-type drift region 6 are both formed in P-type epitaxial layer 2 and make contact with each other laterally. The RF LDMOS device also includes a heavily-doped N-type drain region 7 in the lightly-doped N-type drift region 6, a source region 8 in the p-type channel region 5, and a P-type sinker 10 in the P-type epitaxial layer 2. The P-type sinker 10 extends downward to the top surface of the P-type substrate 1 and contacts with both P-type channel region 5 and the source region 8. Portions of each of the heavily-dope N-type drain region 7, the source region 8 and the P-type sinker 10 are covered by a metal silicide layer 9. A gate oxide layer 3 is formed on a top of the P-type epitaxial layer 2. A gate metal silicide layer 9 and a polysilicon gate 4 are stacked on the gate oxide layer 3 in this order from the top downwards. A Faraday shield 11 formed of a metal layer covers a portion of the polysilicon gate 4 and a portion of the gate oxide layer 3 proximal to the heavily-dope N-type drain region 7. In this design, a length of the lightly-doped N-type drift region 6 (specifically, a distance between facing sides of heavily-dope N-type drain region 7 and polysilicon gate 4) and the Faraday shield 11 that acts as a field plate for electric field distribution regulation together determine whether the RF LDMOS device can have a high withstand voltage. On the other hand, the device also forms an equivalent parasitic NPN transistor with the heavily-dope N-type drain region 7 and the N-type drift region 6 jointly serving as a collector, the P-type channel 5 and the P-type sinker 10 together serving as a base, and the source region 8 serving as an emitter. When in use, the emitter and the base of this parasitic NPN transistor are interconnected and grounded, which causes the P-type channel region 5 to be grounded via the P-type sinker 10 and thereby creates an equivalent base resistance $R_B$. Meanwhile, as shown in FIG. 2, which is an equivalent circuit diagram of the RF LDMOS device, a reverse-biased parasitic diode is formed between the N-type drift region 6 and the P-type channel region 5. During a normal operation of the device, the heavily-dope N-type drain region 7 may be applied with a working voltage and an RF signal, which sum to a value that is nearly equal to the breakdown voltage of the RF LDMOS device, or occasionally with a pulse voltage with the peak value that is greater than the breakdown voltage. This requires both of a reverse breakdown voltage of the equivalent parasitic diode and a snapback voltage of the equivalent parasitic transistor to be about 20 V higher than the breakdown voltage of the RF LDMOS device. To meet this requirement, in addition to a reverse breakdown voltage about 20 V higher than the breakdown voltage, the diode should also have a low leakage current and a low equivalent base resistance $R_B$. FIG. 3 is a diagram depicting characteristic curves of drain voltage versus drain current of the common RF LDMOS devices which have working voltages of 28V and 50V respectively. As seen in FIG. 3, snapback occurs at about 90 V in the RF LDMOS device with a working voltage of 28V and between 140 V and 150 V in the RF LDMOS device with a working voltage of 50V. For an RF LDMOS device, a higher snapback voltage means a better performance.

Different from the above described common RF LDMOS devices that utilize the P-type sinker 10 formed by long-time diffusion as an electric sinker, which forms a lower base resistance $R_B$ with the P-type channel region 5, there is another type of RF LDMOS device, as shown in FIG. 4, which uses a tungsten plug as an electric or heat sinker. Such RF LDMOS device differs in structure from that shown in FIG. 1 in including a tungsten plug 13 instead of the P-type sinker 10 and additionally including a P-type channel connecting region 14. However, although the metal tungsten plug is capable of reducing the electrical resistance with the substrate and facilitating heat dissipation, as this RF LDMOS device still keeps a relative high base resistance $R_B$, it is still possible for snapback to occur which may lead to burnout or other withstand voltage failure of the device.

SUMMARY

Accordingly, an objective of the present invention is to provide an RF LDMOS device with a reduced base resistance of the parasitic NPN transistor and an improved snapback voltage.

Another objective of the present invention is to provide a method of forming the RF LDMOS device.

The above objectives are attained by an RF LDMOS device which includes: a P-type substrate; a lightly-doped P-type epitaxial layer over the P-type substrate; a lightly-doped N-type drain-drift region and a P-type channel region in the lightly-doped P-type epitaxial layer and being laterally adjacent to each other; a tungsten plug in the lightly-doped P-type epitaxial layer and being located at an end of the P-type channel region farther from the lightly-doped N-type drain-drift region, the tungsten plug extending downwards into the substrate and contacting with the P-type channel region; a drain region in the lightly-doped N-type drain-drift region; a heavily-doped P-type channel connecting region and a heavily-doped N-type region in the P-type channel region, the heavily-doped P-type channel connecting region having a first end in contact with the tungsten plug and a second end in contact with the heavily-doped N-type region; a first P-type buried layer substantially in the P-type channel region, the first P-type buried layer connecting with the heavily-doped P-type channel connecting region and the lightly-doped P-type epitaxial layer; a second P-type buried layer in the first P-type buried layer and laterally contacting with the tungsten plug; a gate oxide layer on a surface of the lightly-doped P-type epitaxial layer, the gate oxide layer covering a portion of the P-type channel region and a portion of the lightly-doped N-type drain-drift region; and a polysilicon gate on the gate oxide layer, wherein a portion of the gate oxide layer right under the polysilicon gate has a sloped top surface with an edge proximal to the drain region higher than an edge proximal to the heavily-doped N-type region.

In one specific embodiment, the RF LDMOS device may further include: gate sidewalls on both sides of the polysilicon gate; a metal silicide layer covering the polysilicon gate; a dielectric layer covering a top surface and a side face proximal to the drain region of the metal silicide layer; and a Faraday shield formed of a metal layer, the Faraday shield covering a portion of the dielectric layer, one of the gate sidewalls proximal to the drain region, and a portion of the gate oxide layer proximal to the drain region.

Preferably, the first P-type buried layer may be lightly doped, and the second P-type buried layer may be moderately doped.

The above objectives are also attained by a method of forming an RF LDMOS device, which includes the steps of:
providing a P-type substrate;
forming a lightly-doped P-type epitaxial layer over the P-type substrate;
forming a lightly-doped N-type drain-drift region and a P-type channel region in the lightly-doped P-type epitaxial layer, the lightly-doped N-type drain-drift region and the P-type channel region being laterally adjacent to each other;
forming a tungsten plug in the lightly-doped P-type epitaxial layer, the tungsten plug being located at an end of the P-type channel region farther from the lightly-doped N-type drain-drift region, the tungsten plug extending downwards into the substrate and contacting with the P-type channel region;
forming a drain region in the lightly-doped N-type drain-drift region;
forming a heavily-doped P-type channel connecting region and a heavily-doped N-type region in the P-type channel region, the heavily-doped P-type channel connecting region having a first end in contact with the tungsten plug and a second end in contact with the heavily-doped N-type region;
forming a first P-type buried layer substantially in the P-type channel region, the first P-type buried layer connecting with the heavily-doped P-type channel connecting region and the lightly-doped P-type epitaxial layer;
forming a second P-type buried layer in the first P-type buried layer, the second P-type buried layer being laterally contacting with the tungsten plug;
forming a gate oxide layer on a surface of the lightly-doped P-type epitaxial layer, the gate oxide layer covering a portion of the P-type channel region and a portion of the lightly-doped N-type drain-drift region; and
forming a polysilicon gate on the gate oxide layer, wherein a portion of the gate oxide layer right under the polysilicon gate has a sloped top surface with an edge proximal to the drain region higher than an edge proximal to the heavily-doped N-type region.

Specifically, the method may include the steps of:
step 1) sequentially growing the lightly-doped P-type epitaxial layer and a first gate oxide over the P-type substrate, partially covering the lightly-doped P-type epitaxial layer with a photoresist, and forming the first P-type buried layer by performing a first P-type ion implantation in the lightly-doped P-type epitaxial layer using the photoresist as a mask;

step 2) removing, by a wet etching process, a portion of the first gate oxide not covered by the photoresist, wherein after the wet etching process, an undercut is formed in a portion of the first gate oxide covered by the photoresist due to a lateral corrosion effect of the wet etching process;

step 3) removing the photoresist, growing a second gate oxide and depositing a polysilicon layer;

step 4) etching the polysilicon layer to form the polysilicon gate right above the undercut formed in the first gate oxide, and performing a first N-type ion implantation and a second P-type ion implantation followed by a long-time high-temperature drive-in process to respectively form the lightly-doped N-type drain-drift region and the P-type channel region;

step 5) performing a third P-type ion implantation to form the second P-type buried layer in the first P-type buried layer;

step 6) forming gate sidewalls on both sides of the polysilicon gate, and forming the drain region, the source region and a heavily-doped P-type region by ion implantations and thereafter a rapid thermal annealing process, wherein the heavily-doped P-type region is partially overlapped with the second P-type buried layer;

step 7) removing portions of the second gate oxide respectively above the drain region and the source region and forming a metal silicide layer on a top of each of the drain, source and polysilicon gate regions by a metal silicidation process;

step 8) depositing a first dielectric layer and a metal layer and forming the Faraday shield by photolithography and dry etching, wherein the dry etching stops at the first dielectric layer;

step 9) depositing a second dielectric layer and etching the second dielectric layer and the P-type epitaxial layer to form a deep trench having a bottom in the P-type substrate; and step 10) etching the second dielectric layer to form contact holes therein and depositing titanium, titanium nitride and tungsten in each of the deep trench and the contact holes to form the tungsten plug and contact-hole electrodes, respectively.

Further, in step 1), the P-type substrate may be a heavily doped substrate with a dopant concentration of greater than $10^{20}$ cm$^{-3}$, and the lightly-doped P-type epitaxial layer may be a lightly-doped layer with a dopant concentration of $10^{14}$ cm$^{-3}$ to $10^{16}$ cm$^{-3}$. Moreover, in step 1), the first gate oxide layer may have a thickness of 250 Å to 400 Å, and the first P-type ion implantation may be performed by implanting boron ions with an energy of 120 KeV to 300 KeV at a dose of $10^{12}$ cm$^{-2}$ to $10^{13}$ cm$^{-2}$.

Further, in step 3), the second gate oxide layer may have a thickness of 120 Å to 200 Å; the deposited N-type polysilicon layer may be a heavily-doped N-type polysilicon layer or a non-doped polysilicon layer; and the heavily-doped N-type polysilicon layer may have a thickness of 1500 Å to 4000 Å and be doped with phosphorus or arsenic ions having a concentration of greater than $10^{20}$ cm$^{-3}$.

Further, in step 4), the first N-type ion implantation may be performed by implanting phosphorus ions with an energy of 100 KeV to 200 KeV at a dose of $10^{11}$ cm$^{-2}$ to $10^{13}$ cm$^{-2}$, and the second P-type ion implantation may be performed by implanting boron ions with an energy of lower than 30 KeV at a dose of $10^{12}$ cm$^{-2}$ to $10^{14}$ cm$^{-2}$; and the high-temperature drive-in process may be performed at a temperature of 900° C. to 1050° C. for 30 minutes to 180 minutes.

Further, in step 5), the third P-type ion implantation may be performed by implanting boron ions with an energy of 180 KeV to 280 KeV at a dose of greater than $10^{14}$ cm$^{-2}$.

Further, in step 6), both of the source and drain regions may be formed by implanting phosphorus or arsenic ions with an energy of 30 KeV to 120 KeV at a dose of greater than $10^{15}$ cm$^{-2}$; and the heavily-doped P-type region may be formed by implanting boron ions in one step with an energy of 80 KeV to 150 KeV at a dose of greater than $10^{15}$ cm$^{-2}$, or in two steps including a first step with an energy of 30 KeV to 80 KeV at a dose of greater than $10^{15}$ cm$^{-2}$ and a second step with an energy of 100 KeV to 150 KeV at a dose of greater than $10^{15}$ cm$^{-2}$, the rapid thermal annealing process may be performed at a temperature of 1000° C. to 1100° C. for 5 seconds to 30 seconds.

Further, in step 8), the first dielectric layer may be a silicon oxide layer.

Advantageously, further including the lightly-doped first P-type buried layer under the P-type channel region and the moderately-dope second P-type buried layer in the lightly-doped first P-type buried layer results in a lower base resistance of the parasitic NPN transistor for the RF LDMOS device of the present invention, thereby impeding the occurrence of snapback. Also advantageously, the reverse-biased diode formed between the channel region and the buried layers is capable of clamping the drain-source voltage of the RF LDMOS device and sinking redundant currents to the substrate. Still further advantageously, the design of the gate oxide layer to have a greater thickness proximal to the drain region can help to reduce the hot-carrier effect, and having a smaller thickness proximal to the source region can improve the transconductance of the RF LDMOS device.

DETAILED DESCRIPTION OF THE INVENTION

Figure 14:
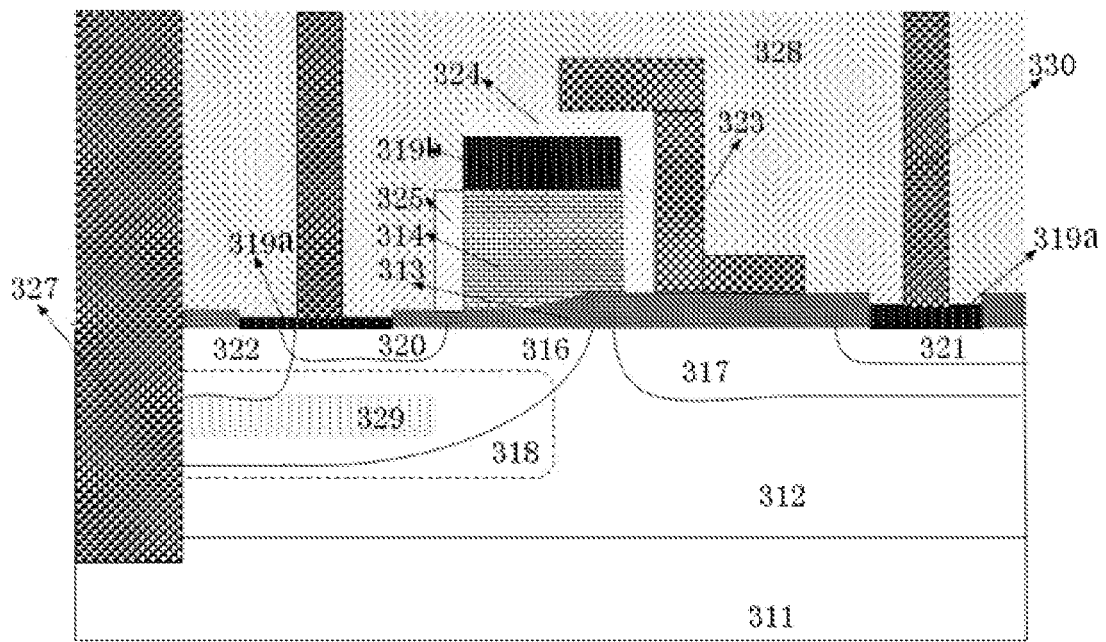
Figure 15:
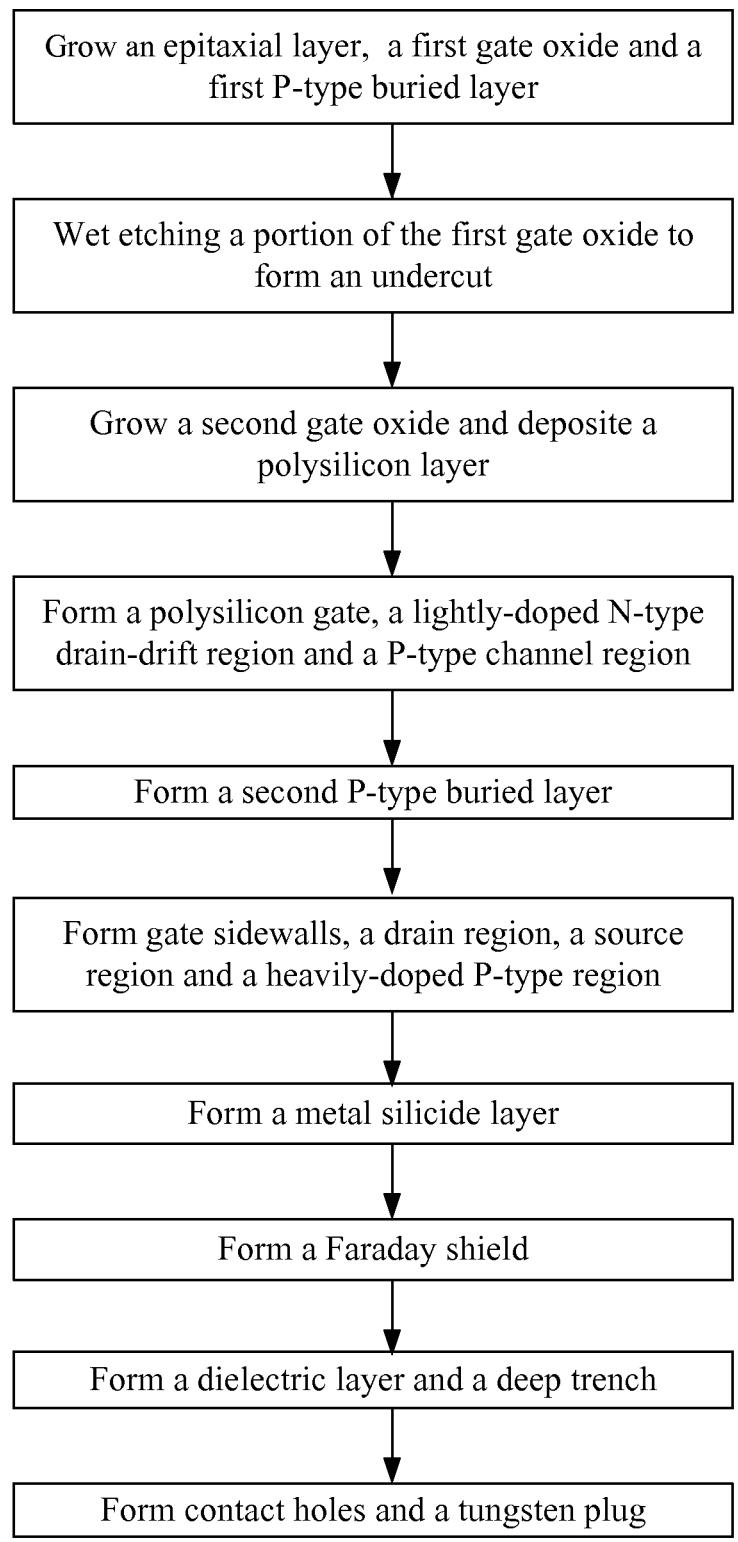
FIG. 15 is a flow chart representing the sequence of the steps of a method embodying the present invention.

FIG. 14 shows an RF LDMOS device constructed in accordance with the present invention.

As seen in FIG. 14, the RF LDMOS device includes a P-type substrate 311 and a lightly-doped P-type epitaxial layer 312 over the P-type substrate 311.

A lightly-doped N-type drain-drift region 317 and a P-type channel region 316 are both formed in the lightly-doped P-type epitaxial layer 312 and are laterally adjacent to each other.

A drain region 321 is formed in the lightly-doped N-type drain-drift region 317, and a metal silicide layer 319a covers a portion of the drain region 321 to pick up a drain for the RF LDMOS device.

A heavily-doped P-type channel connecting region 322 and a heavily-doped N-type region 320 are both formed in the P-type channel region 316 and are in lateral contact with each other. The heavily-doped N-type region 320 serves as a source region for the RF LDMOS device.

The RF LDMOS device further includes a first P-type buried layer 318 substantially in the P-type channel region 316, a second P-type buried layer 329 in the first P-type buried layer 318 and a tungsten plug 327. The first P-type buried layer 318 connects the lightly-doped P-type epitaxial layer 312 with the heavily-doped P-type channel connecting region 322, and the second P-type buried layer 329 laterally contacts with the tungsten plug 327. In one embodiment, the first P-type buried layer 318 is lightly-doped and the second P-type buried layer 329 is moderately doped. Lateral connections between the first and second P-type buried layers and the other components can reduce a base resistance of an equivalent parasitic NPN transistor formed in the RF LDMOS device and improve a snapback voltage of the RF LDMOS device.

A gate oxide layer 313 covers a portion of P-type channel region 316 and a portion of lightly-doped N-type drain-drift region 317. A polysilicon gate 314 is formed on the gate oxide layer 313 and is covered by a metal silicide layer 139b. The RF LDMOS device may further include gate sidewalls 325 on both sides of the polysilicon gate 314, a dielectric layer covering a top surface of the metal silicide layer 319b and a side face thereof proximal to the drain region 321. The dielectric layer is joined with one of the gate sidewalls 325, and they are integrally formed into an L-shape and collectively referred to as a dielectric layer 324 herein. The RF LDMOS device may further include a Faraday shield 323 formed of a metal layer, which covers a portion of the horizontal portion and the entire vertical portion of the dielectric layer 324 and a portion of the gate oxide layer 313 proximal to the drain region 321.

The RF LDMOS device may further include an intermediate dielectric layer 328 wholly covering the structure described above. The tungsten plug 327 is formed through the intermediate dielectric layer 328 and the lightly-doped P-type epitaxial layer 312 and has its bottom in the P-type substrate 311. The tungsten plug 327 is located at an end of the P-type channel region 316 farther from the drain region 321 and is in contact with the heavily-doped P-type channel connecting region 322, the first P-type buried layer 318 and the second P-type buried layer 329. The source and drain regions 320, 321 are each picked up by a contact 330.

A portion of the gate oxide layer 313 under the polysilicon gate 314 has a sloped top surface with an edge proximal to the drain region 321 higher than an edge proximal to the source region 320. The greater thickness of the gate oxide layer 313 proximal to the drain region 321 can help to reduce the hot-carrier effect, and the smaller thickness proximal to the source region 320 can improve the transconductance of the RF LDMOS device.

A method for forming an RF LDMOS device in accordance with the present invention will be described in detail below. The method includes the following steps.

Figure 1:
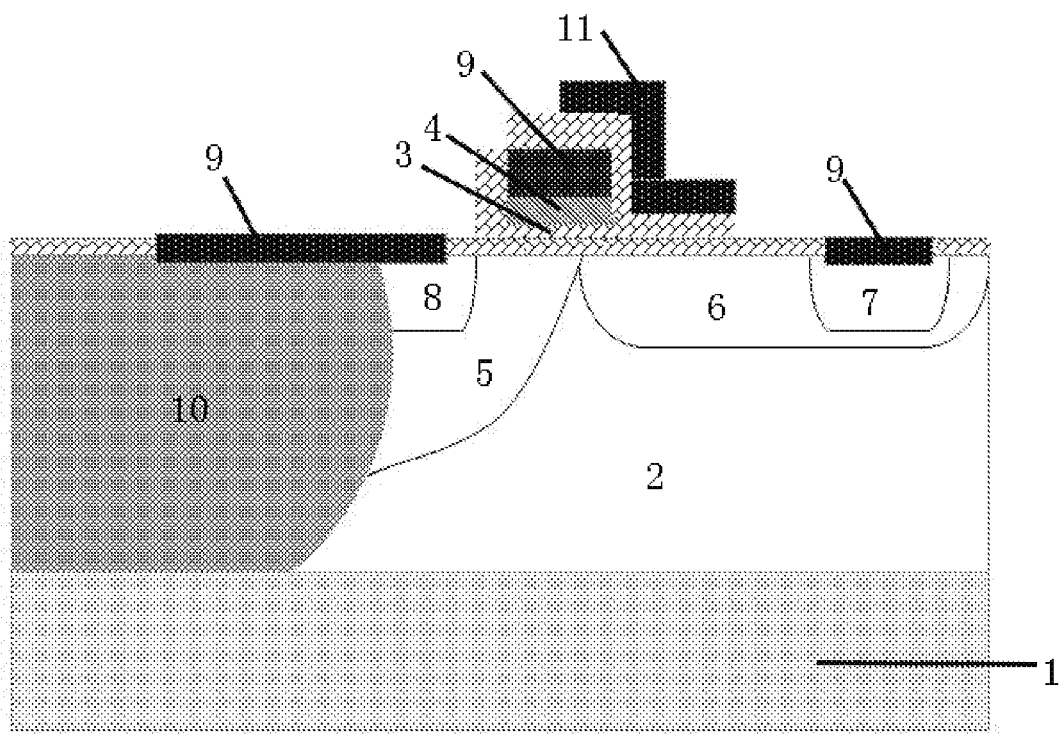
FIG. 1 is a schematic showing a prior art RF LDMOS device.
Figure 2:
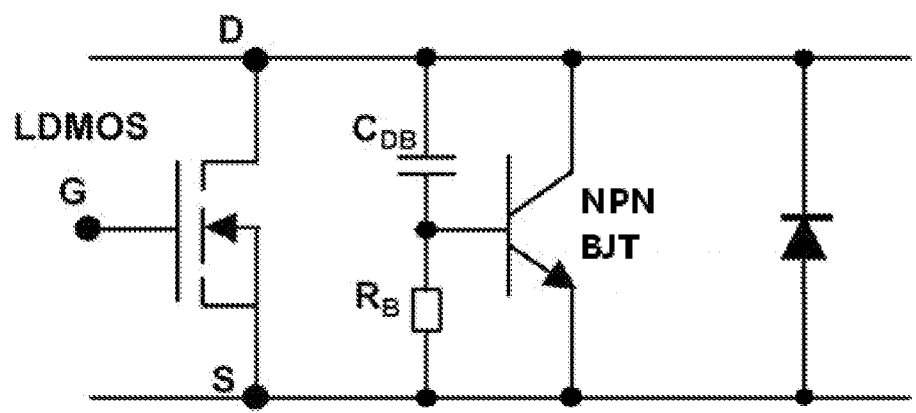
FIG. 2 is an equivalent circuit diagram of the prior art RF LDMOS device.
Figure 3:
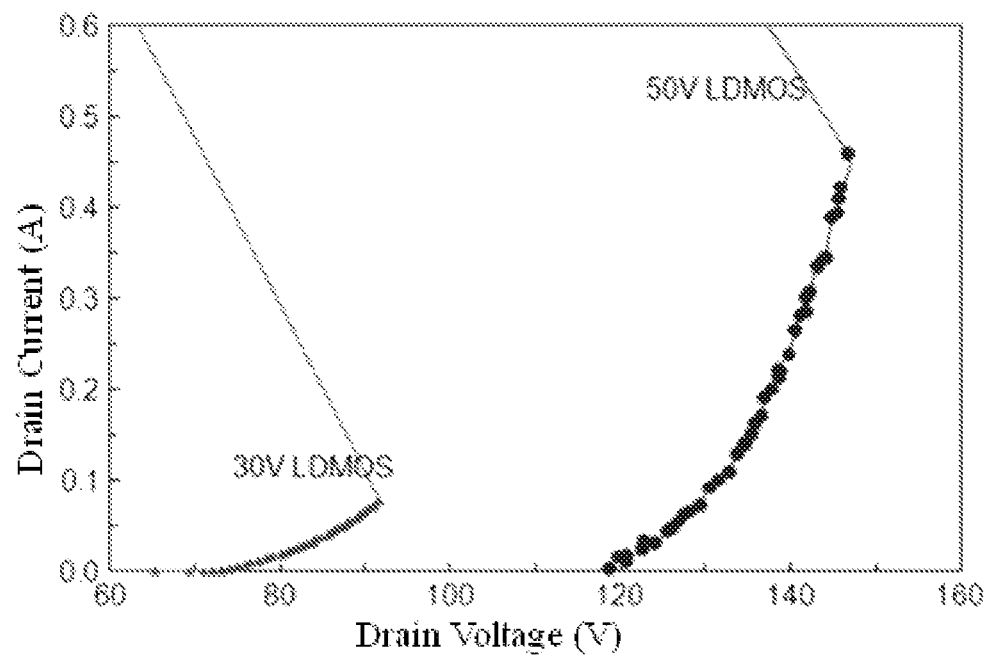
FIG. 3 depicts characteristic curves of drain voltage versus drain current of common RF LDMOS devices, which demonstrate snapback voltages of the RF LDMOS devices.
Figure 4:
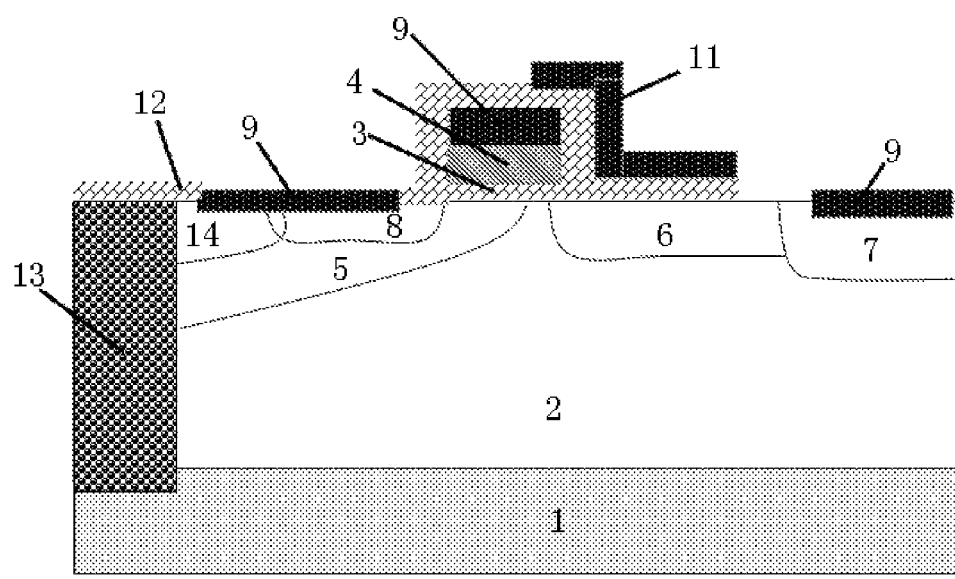
FIG. 4 schematically illustrates a prior art RF LDMOS device incorporating a tungsten plug.
Figure 5:
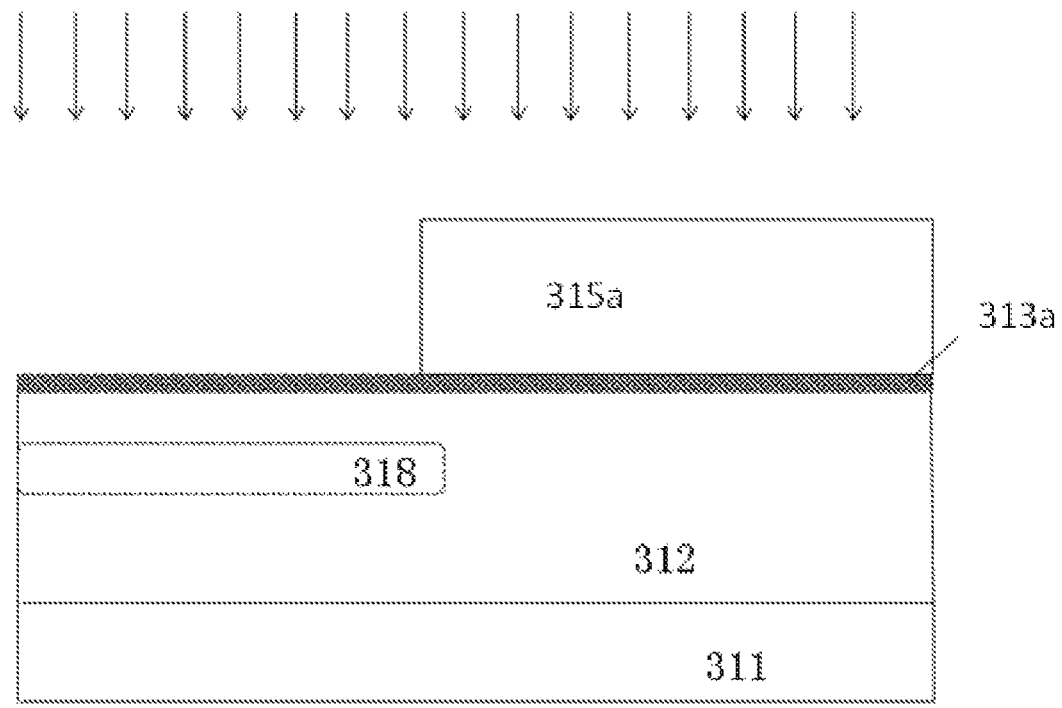
FIGS. 5 to 14 depict the steps of a method embodying the present invention.

Turning now to FIG. 5, in a first step of the method, a lightly-doped P-type epitaxial layer 312 is first grown over a P-type substrate 311. The P-type substrate 311 may be heavily doped and have a dopant concentration of greater than $10^{20}$ cm$^{-3}$. The lightly-doped P-type epitaxial layer 312 may be lightly doped and have a dopant concentration of $10^{14}$ cm$^{-3}$ to $10^{16}$ cm$^{-3}$. Each increase of 1 μm in a thickness of the lightly-doped P-type epitaxial layer 312 can result in an increase of 14 V to 18 V in the breakdown voltage of the RF LDMOS device being fabricated. Next, a first gate oxide 313a is further grown over the lightly-doped P-type epitaxial layer 312 to a thickness of, for example, 250 Å to 400 Å, by means of, for example, a furnace process. Thereafter, a first P-type buried layer 318 is formed by a P-type ion implantation performed at a low dose with a high energy using photoresist 315a coated in advance as a mask.

In one embodiment, boron ions may be implanted in the P-type ion implantation with an energy of 120 KeV to 300 KeV at a dose of $10^{12}$ cm$^{-2}$ to $10^{13}$ cm$^{-2}$.

Figure 6:
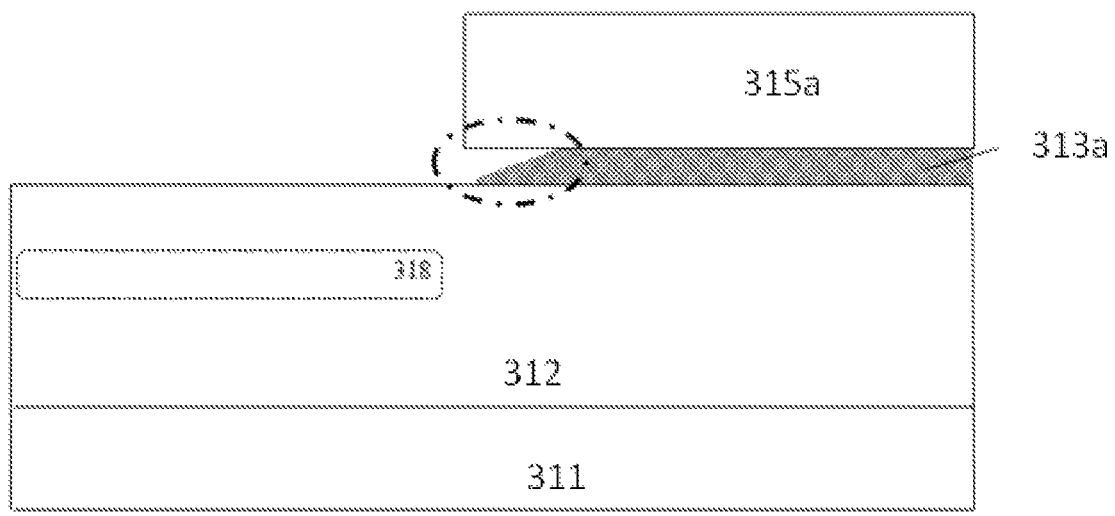

In a second step of the method, as shown in FIG. 6, a portion of the first gate oxide 313a not covered by the photoresist 315a is removed by a wet etching process, and after the wet etching process, an undercut (indicated by the dashed-line circle in FIG. 6) is formed in a portion of the first gate oxide 313a covered by the photoresist 315 due to a lateral corrosion effect of the wet etching process.

Figure 7:
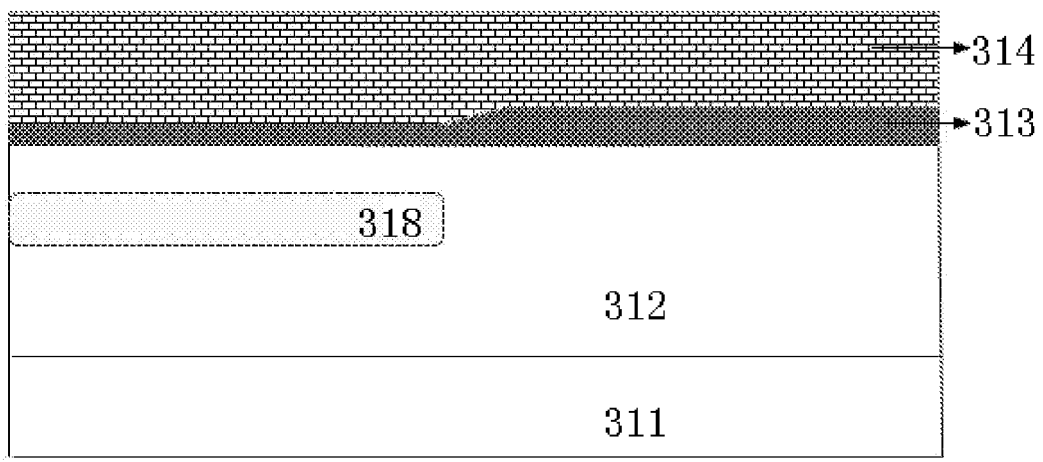

Referring to FIG. 7, in a third step of the method, the photoresist 315a is removed, and a second gate oxide, which is the same material as the first gate oxide 313a is grown over the resulting structure to a thickness of, for example, 120 Å to 200 Å. The remaining first gate oxide 313a and the grown second gate oxide are collectively referred to as a gate oxide layer 313. Then, depositing either a heavily-doped N-type polysilicon layer, or a non-doped polysilicon layer on the gate oxide layer 313, with a thickness of, for example, 1500 Å to 4000 Å. The heavily-doped N-type polysilicon layer may be doped with phosphorus or arsenic ions having a concentration of greater than $10^{20}$ cm$^{-3}$.

Figure 8:
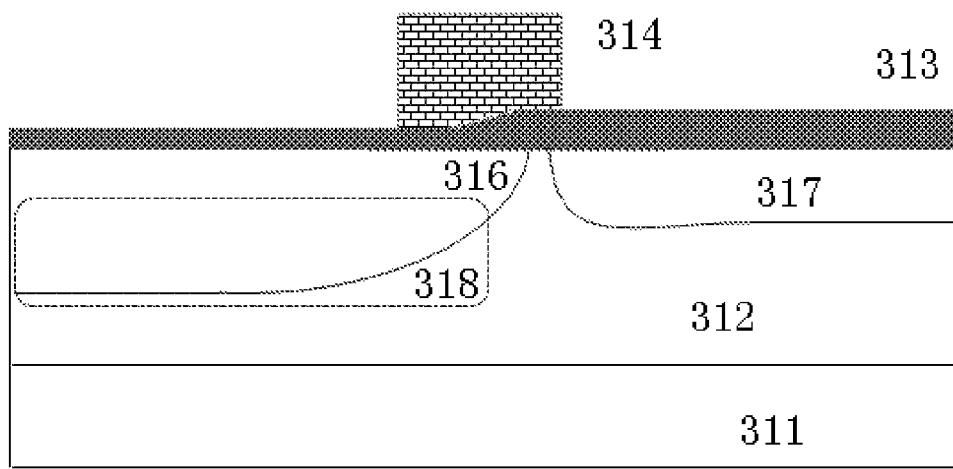

As seen in FIG. 8, in a fourth step of the method, photolithography and dry etching are performed on the polysilicon layer deposited in the third step to form a polysilicon gate 314 right above the undercut formed in the gate oxide layer 313. N-type ions are implanted on one side of the polysilicon gate 314 and P-type ions are implanted on the other side of the polysilicon gate 314, followed by a long-time, high-temperature drive-in process, to respectively form a lightly-doped N-type drain-drift region 317 and a P-type channel region 316. In one embodiment, phosphorus ions may be implanted as the N-type ions with an energy of 100 KeV to 200 KeV at a dose of $10^{11}$ cm$^{-2}$ to $10^{13}$ cm$^{-2}$; boron ions may be implanted as the P-type ions with an energy of, for example, lower than 30 KeV, at a dose of, for example, $10^{12}$ cm$^{-2}$ to $10^{14}$ cm$^{-2}$; the long-time, high-temperature drive-in process may be performed at a temperature of 900° C. to 1050° C. for 30 minutes to 180 minutes.

Figure 9:
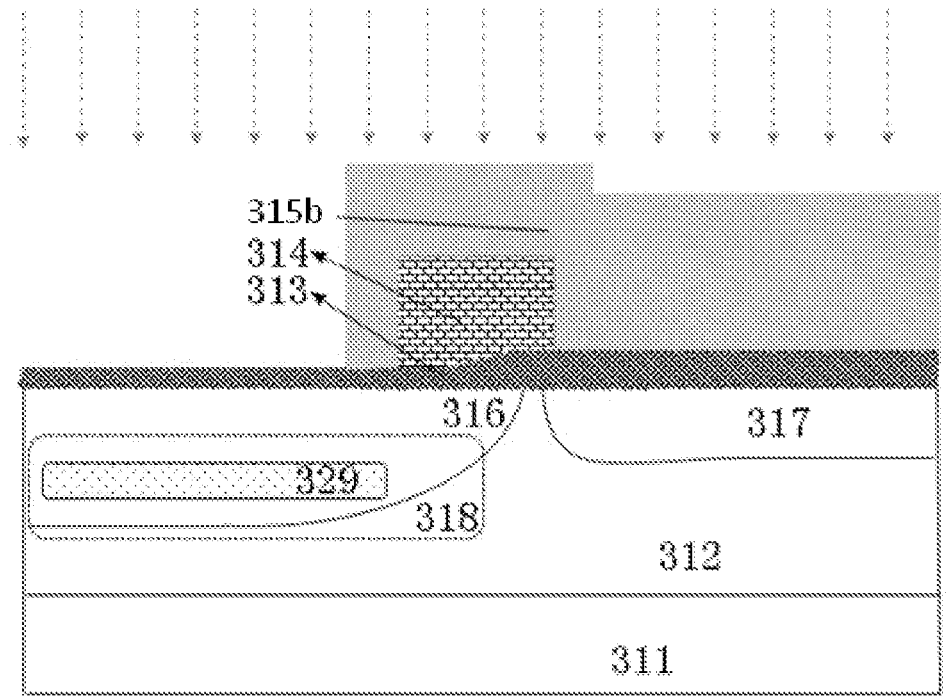

Referring to FIG. 9, in a fifth step of the method, P-type ions for forming a moderately-doped second P-type buried layer 329 described below are implanted with a moderate energy at a moderate dose by using a photoresist 315b as a mask. The second P-type buried layer 329 is overlapped with a heavily-doped P-type region 322 (see FIG. 14) to be formed in a subsequent step described blow. In one embodiment, boron ions may be implanted as the P-type ions with an energy of 180 KeV to 280 KeV at a dose of greater than $10^{14}$ cm$^{-2}$.

Figure 10:
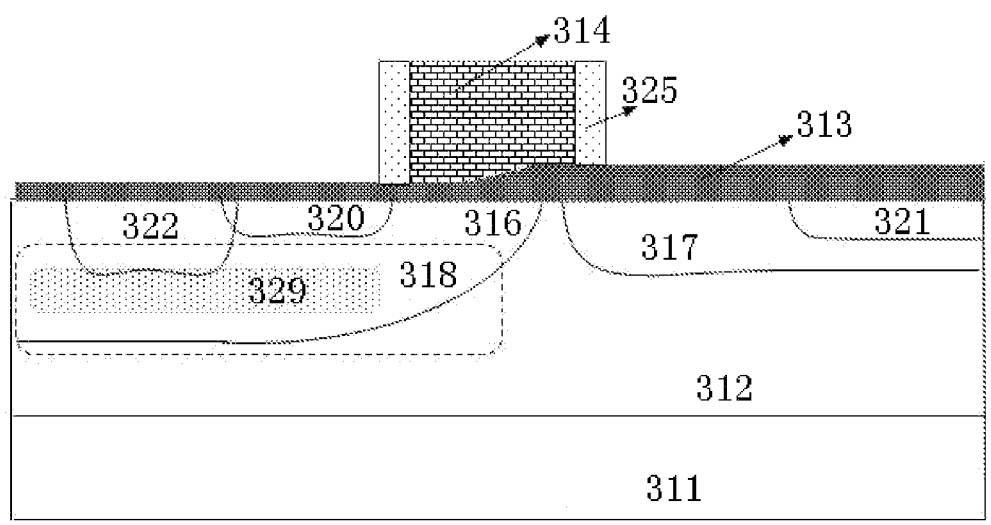

In a sixth step of the method, as shown in FIG. 10, the photoresist 315b is removed and gate sidewalls 325 are formed on both sides of the polysilicon gate 314. Phosphorus or arsenic ions for forming a drain region 321 and a source region 320 are implanted with an energy of, for example, 30 KeV to 120 KeV, at a dose of, for example, greater than $10^{15}$ cm$^{-2}$. Next, P-type ions such as, for example, boron ions, for forming a heavily-doped P-type region 322 configured to connect P-type channel region 316 are implanted either in one step with an energy of 80 KeV to 150 KeV at a dose of greater than $10^{15}$ cm$^{-2}$, or in two steps including a first step with an energy of 30 KeV to 80 KeV at a dose of greater than $10^{15}$ cm$^{-2}$ and a second step with an energy of 100 KeV to 150 KeV at a dose greater than $10^{15}$ cm$^{-2}$. After that, a rapid thermal annealing (RTA) process is performed to simultaneously activate the second P-type buried layer 329, the source region 320, the drain region 321, and the heavily-doped P-type region 322. The RTA process may be performed at a temperature of 1000° C. and 1100° C. for 5 seconds to 30 seconds.

Figure 11:
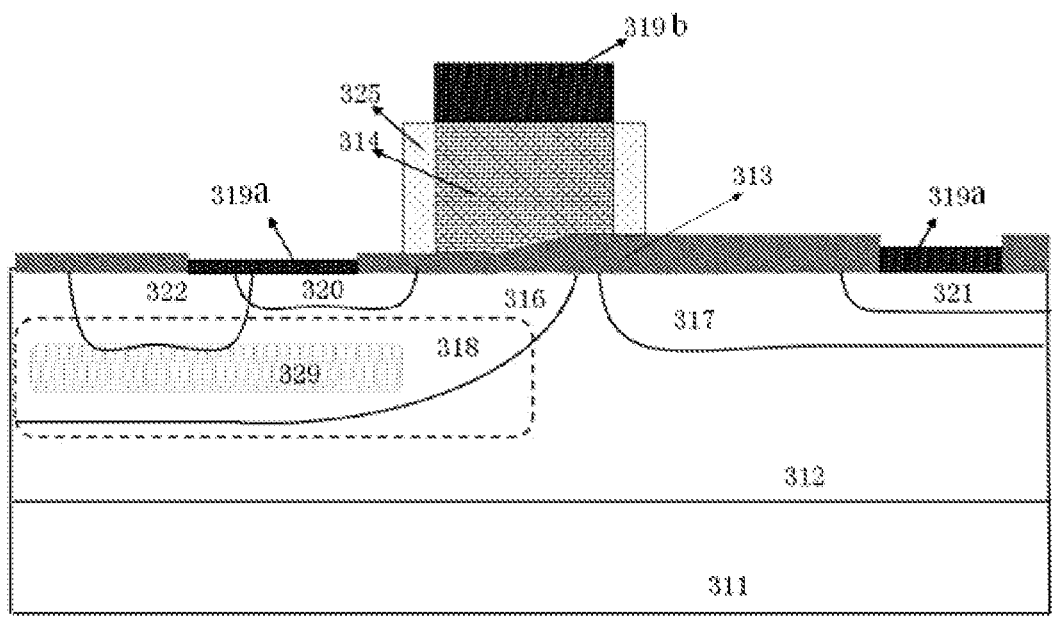

Referring to FIG. 11, in a seventh step of the method, portions of the gate oxide layer 313 are removed to expose a portion of each of the underlying source region 320 and drain region 321. Next, the exposed portions of the source region 320 and drain region 321 are metal silicidated to form a metal silicide layer 319a over each of the source region 320 and the drain region 321.

Figure 12:
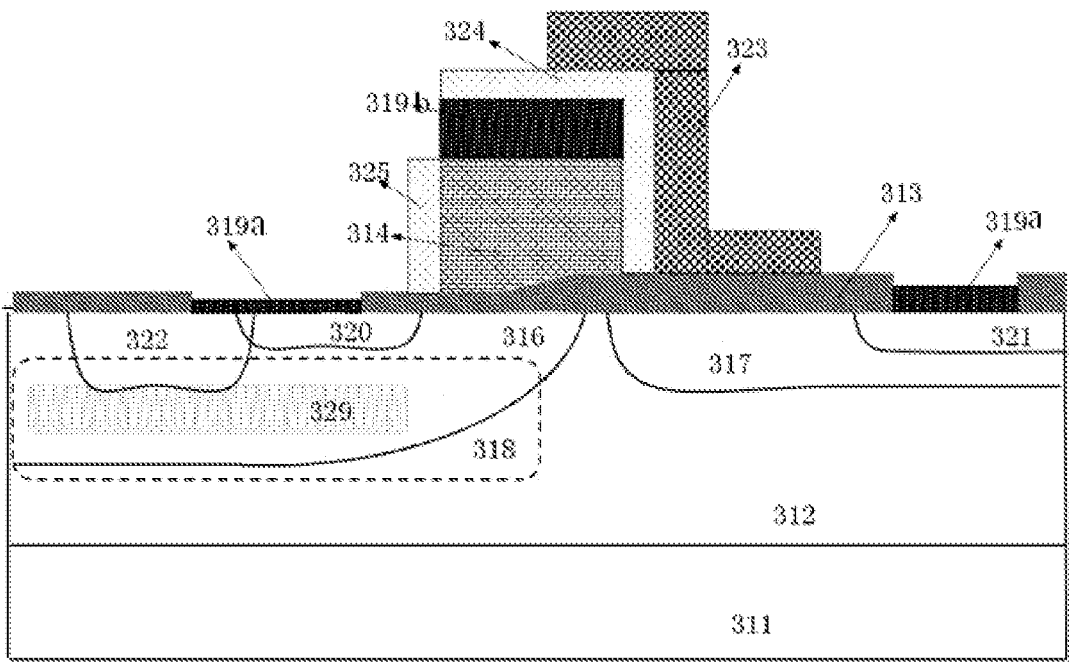

As seen in FIG. 12, in an eighth step of the method, a dielectric layer 324, preferably a silicon oxide layer, and a metal layer, preferably a tungsten-silicon or titanium nitride layer, are deposited. Next, photolithography and dry etching are performed to form a Faraday shield 323, wherein the dry etching stops at the dielectric layer 324. This step can be performed twice to form a double-layer Faraday shield which is able to improve the breakdown voltage of the RF LDMOS device up to 120 V.

Figure 13:
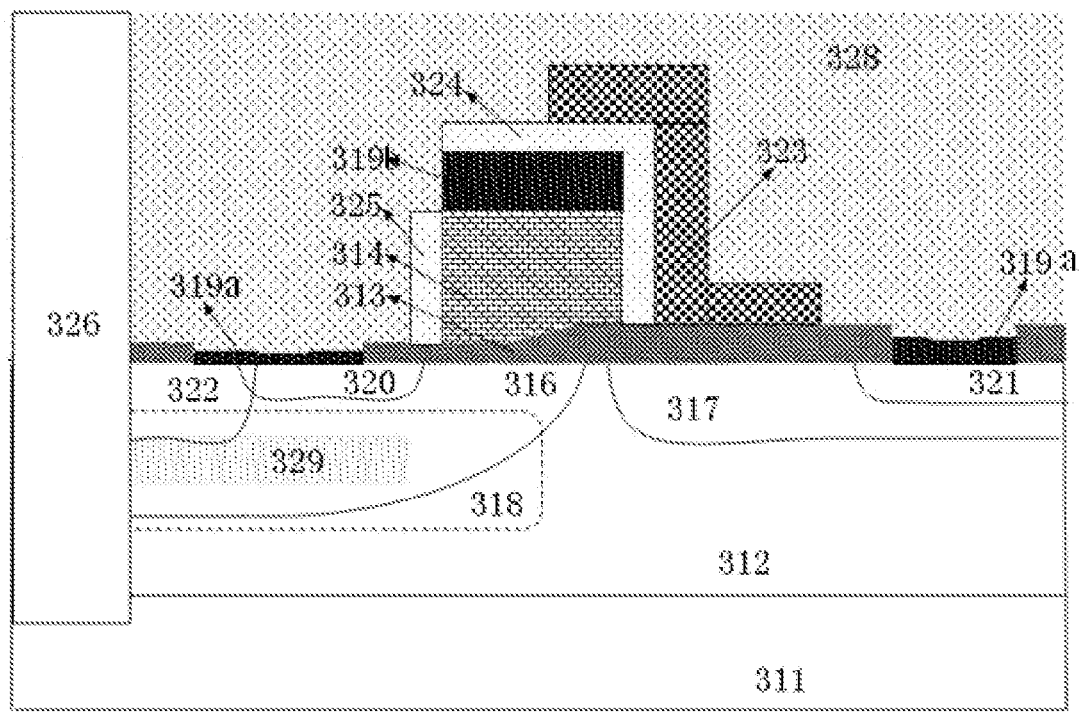

Referring to FIG. 13, in a ninth step of the method, a dielectric layer 328 (an intermediate dielectric layer) where contact holes described below are to be formed is deposited, and thereafter a deep trench 326 is formed by etching the dielectric layer 328 by photolithography and dry etching and further etching the underlying lightly-doped P-type epitaxial layer 312. The formed deep trench 326 has its bottom in the P-type substrate 311.

In a tenth step of the method, as shown in FIG. 14, the dielectric layer 328 is etched to form contact holes therein. Next, titanium, titanium nitride and tungsten are deposited into each of the deep trench 326 and the contact holes to form a tungsten channel for sinking heat and electrons (i.e., a tungsten plug) 327 and contact-hole electrodes 330, thereby completing the RF LDMOS device as shown in FIG. 14.

It is to be understood that the preferred embodiments described and illustrated above are not intended to limit the invention in any way. It will be apparent to those skilled in the art that various modifications and variations can be made in the present invention without departing from the scope of the invention. Thus, it is intended that the present invention embraces all such alternatives, modifications and variations as fall within the true scope of the invention.

What is claimed is:

1. A method of forming a radio frequency (RF) laterally diffused metal oxide semiconductor (LDMOS) device, comprising the steps of:

providing a P-type substrate;

forming a lightly-doped P-type epitaxial layer over the P-type substrate;

forming a lightly-doped N-type drain-drift region and a P-type channel region in the lightly-doped P-type epitaxial layer, the lightly-doped N-type drain-drift region and the P-type channel region being laterally adjacent to each other;

forming a tungsten plug in the lightly-doped P-type epitaxial layer, the tungsten plug being located at an end of the P-type channel region farther from the lightly-doped N-type drain-drift region, the tungsten plug extending downwards into the substrate and contacting with the P-type channel region;

forming a drain region in the lightly-doped N-type drain-drift region;

forming a heavily-doped P-type channel connecting region and a heavily-doped N-type region in the P-type channel region, the heavily-doped P-type channel connecting region having a first end in contact with the tungsten plug and a second end in contact with the heavily-doped N-type region;

forming a first P-type buried layer substantially in the P-type channel region, the first P-type buried layer connecting with the heavily-doped P-type channel connecting region and the lightly-doped P-type epitaxial layer;

forming a second P-type buried layer in the first P-type buried layer, the second P-type buried layer being laterally contacting with the tungsten plug;

forming a gate oxide layer on a surface of the lightly-doped P-type epitaxial layer, the gate oxide layer covering a portion of the P-type channel region and a portion of the lightly-doped N-type drain-drift region; and forming a polysilicon gate on the gate oxide layer, wherein a portion of the gate oxide layer right under the polysilicon gate has a sloped top surface with an edge proximal to the drain region higher than an edge proximal to the heavily-doped N-type region.

2. The method of claim 1, comprising the steps of:

step 1) sequentially growing the lightly-doped P-type epitaxial layer and a first gate oxide over the P-type substrate, partially covering the lightly-doped P-type epitaxial layer with a photoresist, and forming the first P-type buried layer by performing a first P-type ion implantation in the lightly-doped P-type epitaxial layer using the photoresist as a mask;

step 2) removing, by a wet etching process, a portion of the first gate oxide not covered by the photoresist, wherein after the wet etching process, an undercut is formed in a portion of the first gate oxide covered by the photoresist due to a lateral corrosion effect of the wet etching process;

step 3) removing the photoresist, growing a second gate oxide and depositing a polysilicon layer;

step 4) etching the polysilicon layer to form the polysilicon gate right above the undercut formed in the first gate oxide, and performing a first N-type ion implantation and a second P-type ion implantation followed by a long-time high-temperature drive-in process to respectively form the lightly-doped N-type drain-drift region and the P-type channel region;

step 5) performing a third P-type ion implantation to form the second P-type buried layer in the first P-type buried layer;

step 6) forming gate sidewalls on both sides of the polysilicon gate, and forming the drain region, the source region and a heavily-doped P-type region by ion implantations and thereafter a rapid thermal annealing process, wherein the heavily-doped P-type region is partially overlapped with the second P-type buried layer;

step 7) removing portions of the second gate oxide respectively above the drain region and the source region and forming a metal silicide layer on a top of each of the drain, source and polysilicon gate regions by a metal silicidation process;

step 8) depositing a first dielectric layer and a metal layer and forming the Faraday shield by photolithography and dry etching, wherein the dry etching stops at the first dielectric layer;

step 9) depositing a second dielectric layer and etching the second dielectric layer and the P-type epitaxial layer to form a deep trench having a bottom in the P-type substrate; and step 10) etching the second dielectric layer to form contact holes therein and depositing titanium, titanium nitride and tungsten in each of the deep trench and the contact holes to form the tungsten plug and contact-hole electrodes, respectively.

3. The method of claim 2, wherein, in the step 1), the P-type substrate is a heavily doped substrate with a dopant concentration of greater than $10^{20}$ cm$^{-3}$, and the lightly-doped P-type epitaxial layer is a lightly-doped layer with a dopant concentration of $10^{14}$ cm$^{-3}$ to $10^{16}$ cm$^{-3}$.

4. The method of claim 3, wherein, in the step 1), the first gate oxide has a thickness of 250 Å to 400 Å.

5. The method of claim 3, wherein, in the step 1), the first P-type ion implantation is performed by implanting boron ions with an energy of 120 KeV to 300 KeV at a dose of $10^{12}$ cm$^{-2}$ to $10^{13}$ cm$^{-2}$.

6. The method of claim 2, wherein, in the step 3), the second gate oxide has a thickness of 120 Å to 200 Å.

7. The method of claim 2, wherein, in the step 3), the deposited polysilicon layer is a heavily-doped N-type polysilicon layer or a non-doped polysilicon layer.

8. The method of claim 7, wherein the heavily-doped N-type polysilicon layer has a thickness of 1500 Å to 4000 Å and is doped with phosphorus or arsenic ions having a concentration of greater than $10^{20}$ cm$^{-3}$.

9. The method of claim 2, wherein, in the step 4), the first N-type ion implantation is performed by implanting phosphorus ions with an energy of 100 KeV to 200 KeV at a dose of $10^{11}$ cm$^{-2}$ to $10^{13}$ cm$^{-2}$, and the second P-type ion implantation is performed by implanting boron ions with an energy of lower than 30 KeV at a dose of $10^{12}$ cm$^{-2}$ to $10^{14}$ Cm$^{-2}$.

10. The method of claim 9, wherein, in the step 4), the high-temperature drive-in process is performed at a temperature of 900° C. to 1050° C. for 30 minutes to 180 minutes.

11. The method of claim 2, wherein, in the step 5), the third P-type ion implantation is performed by implanting boron ions with an energy of 180 KeV to 280 KeV at a dose of greater than $10^{14}$ cm$^{-2}$.

12. The method of claim 2, wherein, in the step 6), both of the source and drain regions are formed by implanting phosphorus or arsenic ions with an energy of 30 KeV to 120 KeV at a dose of greater than $10^{15}$ cm$^{-2}$; and the heavily-doped P-type region is formed by implanting boron ions in one step with an energy of 80 KeV to 150 KeV at a dose of greater than $10^{15}$ cm$^{-2}$, or in two steps including a first step with an energy of 30 KeV to 80 KeV at a dose of greater than $10^{15}$ cm$^{-2}$ and a second step with an energy of 100 KeV to 150 KeV at a dose of greater than $10^{15}$ cm$^{-2}$.

13. The method of claim 12, wherein, in the step 6), the rapid thermal annealing process is performed at a temperature of 1000° C. to 1100° C. for 5 seconds to 30 seconds.

14. The method of claim 2, wherein, in the step 8), the first dielectric layer is a silicon oxide layer.

* * * * *